United States Patent
Wu et al.

(10) Patent No.: US 11,788,007 B2
(45) Date of Patent: Oct. 17, 2023

(54) METHOD FOR REMOVING HARD MASKS

(71) Applicant: ENTEGRIS, INC., Billerica, MA (US)

(72) Inventors: Hsing-Chen Wu, Hsinchu (TW); Emanuel I. Cooper, Scarsdale, NY (US); Min-Chieh Yang, Hsinchu (TW)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 17/389,879

(22) Filed: Jul. 30, 2021

(65) Prior Publication Data

US 2022/0033709 A1 Feb. 3, 2022

Related U.S. Application Data

(60) Provisional application No. 63/058,997, filed on Jul. 30, 2020.

(51) Int. Cl.
*C09K 13/04* (2006.01)
*H01L 21/311* (2006.01)
*C09K 13/06* (2006.01)
*C09K 13/10* (2006.01)
*H10B 69/00* (2023.01)

(52) U.S. Cl.
CPC ............. *C09K 13/04* (2013.01); *C09K 13/06* (2013.01); *C09K 13/10* (2013.01); *H01L 21/311* (2013.01); *H01L 21/31111* (2013.01); *H01L 21/31133* (2013.01); *H10B 69/00* (2023.02)

(58) Field of Classification Search
None
See application file for complete search history.

(56) References Cited

U.S. PATENT DOCUMENTS

| | | | |
|---|---|---|---|
| 7,079,740 B2 | 7/2006 | Vandroux | |
| 7,576,441 B2 | 8/2009 | Yin | |
| 8,026,200 B2 | 9/2011 | Cooper | |
| 9,129,911 B2 | 9/2015 | Doan | |
| 9,299,581 B2 | 3/2016 | Lee | |
| 10,138,117 B2 | 11/2018 | Chen | |
| 2009/0281016 A1* | 11/2009 | Cooper | G03F 7/423 510/176 |
| 2010/0136794 A1* | 6/2010 | Ferstl | G03F 7/423 438/745 |
| 2011/0275221 A1* | 11/2011 | Schier | G03F 7/423 252/79.2 |
| 2020/0135485 A1 | 4/2020 | Uvais | |

FOREIGN PATENT DOCUMENTS

| | | |
|---|---|---|
| JP | 2009147055 A | 7/2009 |
| KR | 20200032782 A | 3/2020 |

OTHER PUBLICATIONS

Entegris, Inc.; "96 Layers and Beyond: Solving 3D NAND Material and Integration Challenges"; 2018.

* cited by examiner

*Primary Examiner* — Jiong-Ping Lu

(57) ABSTRACT

Provided are compositions and methods useful in etching, i.e., removing amorphous carbon hard masks which have been doped with elements such as boron, chlorine, or nitrogen. The compositions utilize concentrated sulfuric acid, water, and at least one oxidizing agent. In the operation of the method, the composition selectively removes the doped hard mask layer, even in the presence of layers such as silicon dioxide, silicon nitride, tantalum nitride, and polysilicon, with good selectivity.

9 Claims, No Drawings

METHOD FOR REMOVING HARD MASKS

FIELD OF THE INVENTION

The invention relates generally to the field of microelectronic device manufacturing, and to methodology for the etching, i.e., removal of boron-doped amorphous carbon hard masks.

BACKGROUND OF THE INVENTION

Processing semiconductor and microelectronic devices involves various steps of depositing layers of materials and removing materials by chemical processes referred to as "etching." By etching, a thin mask layer is placed over a layer of deposited material. Openings are then formed in the mask and select portions of the substrate are exposed. The masked substrate is then contacted with an etchant, which contacts material of the underlying substrate through the openings in the mask and chemically degrades and removes the material of the substrate to form openings (three-dimensional spaces) in the substrate.

Many newer types of substrates, such as those used to prepare three-dimensional memory devices, are processed to form openings that have a high aspect ratio, e.g., openings that have a depth extending into a substrate that is significantly greater than a width dimension (e.g., diameter) of the opening. As one example, vertically extending "channel holes" of a 3D NAND memory device are formed by etching a vertically extending opening in a depth direction into a stack of many layers of deposited films. The depth of the channel hole may be twenty, forty, or fifty times greater than a diameter of the channel hole, or more. Forming this type of high aspect ratio feature in a microelectronic device by etching requires highly specialized, accurate, and precise etching processes.

For this type of etching step, a chemically-resistant "hard mask" is placed over the top layer of the multiple layers of deposited films. The film layers, sometimes referred to as a "film stack," are functional materials of the memory device and may be layers of deposited silicon oxide, silicon nitride, polysilicon, or the like. The hard mask is resistant to an etching solution that is used to chemically degrade and remove materials of the film stack to form the high aspect ratio opening in the substrate (e.g., channel hole).

One common type of hard mask is an amorphous carbon hard mask. This type of hard mask is deposited onto a microelectronic device substrate as a continuous layer and is then etched to form openings in the hard mask. A subsequent step of etching the underlying substrate is then performed by exposing the substrate with the hard mask to a gaseous chemical etchant capable of chemically degrading a material of the film stack. The gaseous etchant passes through the openings in the hardmask to contact and etch away, i.e., remove, material of the substrate to produce an opening in the substrate. After the substrate material has been etched away as desired, the hardmask must be removed from the substrate to allow the substrate to be further processed to a finished microelectronic device.

Producing precisely-formed and well-defined substrate openings that exhibit a high aspect ratio can be very challenging. One component of etching processes that is often studied for improving the overall process is the hard mask, including the composition of the hardmask and methods of applying and removing the hard mask.

Hard masks may consist of thick amorphous carbon films or a variety of similar materials capable of withstanding plasma etching processes. Amorphous carbon is an imperfect hard mask material for 3D NAND structures because it is susceptible to etching when exposed to reactive plasma for the length of time require to process such structures. One method of increasing the durability of such amorphous carbon films includes the doping of the carbon layer with etch-resistant elements such as boron, chlorine, and nitrogen. In the case of boron-doping, the mask is hardened, thereby forming boron carbide and making the mask resemble a ceramic morphology and thus resistant to chemical etchants. Such masks then are ultimately removed using (dry) reactive ion etching techniques utilizing 02 plasma, or 02 plasma in conjunction with $H_2$ plasma. (See, for example, U.S. Pat. No. 9,229,581).

However, a need exists for improved methodologies for removing hard masks which have been doped with etch-resistant elements such as boron.

SUMMARY OF THE INVENTION

In summary, the invention provides compositions and methods useful in etching, i.e., removing amorphous carbon hard masks which have been doped with elements such as boron, chlorine, or nitrogen. The compositions utilize concentrated sulfuric acid, water, and at least one oxidizing agent. The oxidizing agent is in one embodiment chosen from iodine-containing oxidants such as iodate salts and periodic acid. The compositions may further comprise an additional acid which is other than sulfuric acid. In the method of the invention, the compositions may be applied to the mask which is desirably removed at elevated temperatures. In the operation of the method, the composition selectively removes the doped hard mask layer, even in the presence of layers such as silicon dioxide, silicon nitride, tantalum nitride, and polysilicon, with good selectivity.

Thus, in the performance of the method of the invention is well-suited in applications including 3D-NAND structures possessing 96 layers and beyond.

DETAILED DESCRIPTION OF THE INVENTION

1. In a first aspect, the invention provides a method for removing an amorphous carbon hard mask from a microelectronic device, wherein said hard mask has been doped with an element selected from boron, chlorine, and nitrogen to form a doped hard mask, the method comprising contacting said microelectronic device with a composition comprising:
   a. about 50 to about 98 weight percent of $H_2SO_4$, based on the total weight of the composition;
   b. water; and
   c. about 0.1 to about 30 weight percent of at least one oxidizing agent, based on the total weight of the composition.

In one embodiment, the element is boron.

In certain embodiments, the oxidizing agent is chosen from oxidizing agents such as iodates and periodic acid, nitric acid, perchloric acid, and permanganates, and persulfates. In one embodiment, the oxidizing agent is present in an amount of about 1 to about 15 weight percent or about 5 to 10 weight percent. In another embodiment, the oxidizing agent is periodic acid and is present in an amount of about 5 to about 8%. In another embodiment, the oxidizing agent is periodic acid and is present in an amount of about 5 to about 6%.

In one embodiment, the iodine-containing oxidizing agent is chosen from $H_5IO_6$, $HIO_4$, or a mixture thereof.

In one embodiment, the composition comprises about 65 to about 85 weight percent of $H_2SO_4$.

In certain embodiments, the composition further comprises an acid which is other than $H_2SO_4$. In certain embodiments, the acid which is other than $H_2SO_4$ is chosen from methanesulfonic acid, trifluoromethanesulfonic acid, boric acid, and phosphoric acid.

In certain embodiments, the composition further comprises at least one surfactant. As used herein the term "surfactant" refers to an organic compound that lowers the surface tension (or interfacial tension) between two liquids or between a liquid and a solid, typically an organic amphiphilic compound that contains a hydrophobic group (e.g., a hydrocarbon (e.g., alkyl) "tail") and a hydrophilic group. Advantageously, the surfactants are thermally stable and stay ionic under strongly acidic conditions such as the conditions of an etching process of the present invention. Examples include perfluoroalkylsulfonic acids and long-chain quaternary ammonium compounds (e.g., dodecyltrimethylammonium hydrogen sulfate). Fluorinated non-ionic surfactants such as Chemours' Capstone® FS-31/FS-35 can also be used. Non-ionic unfluorinated surfactants such as poly(ethylene glycol)-poly(propylene glycol) copolymers ("PEG-PPG") can also be used.

The amount of surfactant in an etching composition can be an amount that, in combination with the other materials of an etching composition, will provide desired overall performance. For example, the composition can contain an amount of surfactant that may be in a range from about 0.001 to about 10 weight percent, e.g., from about 0.01 to about 0.5, 1, 2, 7, or 7 weight percent surfactant based on total weight of the composition.

The compositions of the invention can thus be utilized to etch or remove such boron, chlorine, or nitrogen doped amorphous hard masks by applying such compositions to the surface of the microelectronic device. Depending on the thickness of the film to be removed, the concentration of sulfuric acid and the temperature of operation may be varied and optimized. In one embodiment, the application of the composition is done in an environment of about 100° to 170° C. In one embodiment, the application of the compositions is done in an environment of about 140° C. to 170° C.

The compositions of the invention may be readily formulated as single-package formulations or multi-part formulations that are mixed at or before the point of use, e.g., the individual parts of the multi-part formulation may be mixed at the tool, in a storage tank upstream of the tool, or in a shipping package that delivers the mixed formulation directly to the tool. For example, a single shipping package may include at least two separate containers or bladders that may be mixed together by a user at the fab and the mixed formulation may be delivered directly to the tool. One of the at least two containers or bladders may include the oxidizing agent, which may be a solid, while another of the at least two containers may include sulfuric acid solution. In one embodiment, one of the at least two containers or bladders includes the oxidizing agent, while a second of the at least two containers or bladders includes sulfuric acid. In another embodiment, one of the at least two containers or bladders includes the oxidizing agent, while a second of the at least two containers or bladders includes a mixture of sulfuric acid and another acid which is other than sulfuric acid. In each case, if water is to be added, it can be added to one and/or both containers prior to leaving the manufacturer, may be added at the fab prior to use, or combinations of both, as readily determined by one skilled in the art. The shipping package and the internal containers or bladders of the package must be suitable for storing and shipping said composition components, for example, packaging provided by Advanced Technology Materials, Inc. (Danbury, Conn., USA).

Alternatively, a concentrate of the composition may be formulated and packaged in one container for shipping and for mixture with on-site sulfuric acid and optionally an acid which is other than sulfuric acid prior to and/or during use, wherein said method of use is described herein. For example, the concentrate may comprise at least one oxidizing agent, water, and wherein the oxidizing agent may have a concentration in a range from about 0.1 wt % to about 30 wt %, or about 1 wt % to about 15 wt %, based on the total weight of the concentrate. The amount of sulfuric acid in said concentrate, when present, may be in a range from about 50 wt % to about 96 wt %, based on the total weight of the concentrate. In a preferred embodiment, the concentrate for combination with on-site acid(s) comprises, consists of, or consists essentially of at least oxidizing agent, water, and optionally at least one acid which is other than sulfuric acid. In another embodiment, the concentrate for combination with on-site acid(s) comprises, consists of, or consists essentially of at least one iodine-containing oxidizing agent, water, and at least one acid which is other than sulfuric acid. The ratio of concentrate to on-site acid(s) is readily determined by one skilled in the art knowing how much oxidizing agent is desired in the low pH composition and how much acid is present in the concentrate.

Another aspect relates to a kit including, in one or more containers, one or more components adapted to form the compositions of either aspect, as described herein. The containers of the kit must be suitable for storing and shipping said compositions, for example, NOWPak® containers (Advanced Technology Materials, Inc., Danbury, Conn., USA). The one or more containers which contain the components of the compositions described herein preferably include means for bringing the components in said one or more containers in fluid communication for blending and dispense. For example, referring to the NOWPak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, the system preferably includes a dispensing port for dispensing the blended removal composition to a process tool.

Substantially chemically inert, impurity-free, flexible and resilient polymeric film materials, such as PTFE or PTFA, are preferably used to fabricate the liners for said one or more containers. Desirable liner materials are processed without requiring co-extrusion or barrier layers, and without any pigments, UV inhibitors, or processing agents that may adversely affect the purity requirements for components to be disposed in the liner. A listing of desirable liner materials include films comprising virgin polytetrafluoroethylene (PTFE), PFA, Haler®, and so on. In certain embodiments, the thicknesses of such liner materials are in a range from about 5 mils (0.005 inch) to about 30 mils (0.030 inch), as for example a thickness of 20 mils (0.020 inch).

Regarding the containers for the kits, the disclosures of the following patents and patent applications are hereby incorporated herein by reference in their respective entireties: U.S. Pat. No. 7,188,644 entitled "APPARATUS AND METHOD FOR MINIMIZING THE GENERATION OF PARTICLES IN ULTRAPURE LIQUIDS;" U.S. Pat. No. 6,698,619 entitled "RETURNABLE AND REUSABLE, BAG-IN-DRUM FLUID STORAGE AND DISPENSING CONTAINER SYSTEM;" International Application No. PCT/US08/63276 entitled "SYSTEMS AND METHODS FOR MATERIAL BLENDING AND DISTRIBUTION" filed on May 9, 2008 in the name of John E. Q. Hughes; and International Application No. PCT/US08/85826 entitled "SYSTEMS AND METHODS FOR DELIVERY OF FLUID-CONTAINING PROCESS MATERIAL COMBINATIONS" filed on Dec. 8, 2008 in the name of John E. Q. Hughes et al.

Accordingly, in a further aspect, the invention provides a kit comprising, in one or more containers, one or more components a., b., and c., recited above, adapted to form the compositions of the invention, as described herein.

This invention can be further illustrated by the following examples of preferred embodiments thereof, although it will be understood that these examples are included merely for purposes of illustration and are not intended to limit the scope of the invention unless otherwise specifically indicated.

EXAMPLES

Formulation Examples 1-3

| Weight % | *DIW | *MSA | $H_5IO_6$ | $H_2SO_4$ | Temperature (° C.) | *BHM Etch Rate (Å/minute) |
|---|---|---|---|---|---|---|
| Example1 | 1.95 | 1 | 2.6 | 94.45 | 145 | 388.9 |
|  | 1.95 | 1 | 2.6 | 94.45 | 155 | 451.7 |
| Example 2 | 1.89 | 1 | 5.66 | 91.45 | 155 | 943.4 |
| Example 3 | 19.38 | 1 | 5.87 | 73.75 | 155 | 467.3 |

*DIW = deionized water
*MSA = methanesulfonic acid
*BHM = boron hard mask

Example 1 below describes the general method for preparing and testing the Formulation Examples 1 through 3.

Example A—Preparation of Etching Composition

A 50% by weight sample of $H_5IO_6$, was combined with water and methane sulfonic acid. To this mixture was slowly added 96% $H_2SO_4$ with ice-water bath for cooling as a means of controlling the exothermic reaction. The total solution weight of the beaker test was 300 g in a 250 ml three-neck glass bottle. The resulting solution was heated with a heating mantle while controlling the temperature to 155° C. Stirring was maintained throughout at 360 rpm.

Example B—Coupon Tests

Wafer was cut into 1.5×3 cm² size, and the coupon fastened on a Teflon™ (polytetrafluoroethylene) sample holder by Teflon™ tape. The processing time for the blanket wafer was 30-60 min and the pattern wafer (50% over-etch) was 120 min. Following the etching process, the coupons were washed with deionized water for 1 minute and blown dry with nitrogen. The film loss was measured by ellipsometer and the pattern wafer was checked by SEM (scanning electron microscopy).

The table below compares etch rates for boron-doped amorphous film with other surface compositions for the formulation of Example 3:

Testing was done at 155° C. for 30 minutes, while stirring at 360 rpm with a magnetic stirring rod. The film loss was measured using an ellipsometer.

|  | Etch Rate (Å/Minute) | Selectivity |
|---|---|---|
| Boron doped amorphous carbon film | 467.3 |  |
| W silicide | 0.3 | 1540 |
| SiCN | 0.5 | 8873 |
| SiN | −0.2 | >4000 |
| $SiO_2$ | −0.5 | >4000 |
| BPSG | −0.03 | >4000 |
| Doped Poly | −0.22 | >4000 |
| TaN | −0.1 | >4000 |

BPSG = boron phosphorous silica glass
Doped Poly = boron doped polysilicon

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respect, only illustrative. Changes may be made in details, particularly in matters of shape, size, and arrangement of parts without exceeding the scope of the disclosure. The disclosure's scope is, of course, defined in the language in which the appended claims are expressed.

The invention claimed is:

1. A method for removing an amorphous carbon hard mask from a microelectronic device, wherein said hard mask has been doped with an element selected from boron, chlorine, and nitrogen to form a doped hard mask, the method comprising contacting said microelectronic device with a composition comprising:
   a. about 50 to about 98 weight percent of $H_2SO_4$, based on the total weight of the composition;
   b. water; and
   c. about 0.1 to about 30 weight percent of at least one oxidizing agent, based on the total weight of the composition, wherein the at least one oxidizing agent is chosen from nitric acid and perchloric acid,
   wherein the composition has a doped hard mask etch rate greater than 400 Å/minute at 155° C. and contacting said microelectronic device with the composition is conducted at about 155° C.

2. The method of claim 1, wherein the element is boron.

3. The method of claim 1, wherein the oxidizing agent is utilized in a range of about 1 to about 15 weight percent.

4. The method of claim 1, wherein the oxidizing agent is utilized in a range of about 5 to about 10 weight percent.

5. The method of claim 1, wherein the composition comprises about 65 to about 85 weight percent of $H_2SO_4$.

6. The method of claim 1, further comprising a second acid which is other than the at least one oxidizing agent or $H_2SO_4$.

7. The method of claim 6, wherein the acid is chosen from methanesulfonic acid, trifluoromethanesulfonic acid, boric acid, and phosphoric acid.

8. The method of claim 1, further comprising at least one surfactant.

9. The method of claim 1, wherein further comprising contacting a 3D-NAND storage device.

* * * * *